United States Patent
Ichinokura et al.

(10) Patent No.: US 11,222,998 B2
(45) Date of Patent: Jan. 11, 2022

(54) OPTICAL SEMICONDUCTOR APPARATUS AND METHOD OF MANUFACTURING OPTICAL SEMICONDUCTOR APPARATUS

(71) Applicant: Nikkiso Co., Ltd, Tokyo (JP)

(72) Inventors: Hiroyasu Ichinokura, Hakusan (JP); Shoichi Niizeki, Hakusan (JP)

(73) Assignee: NIKKISO CO., LTD., Tokyo (JP)

(*) Notice: Subject to any disclaimer, the term of this patent is extended or adjusted under 35 U.S.C. 154(b) by 0 days.

(21) Appl. No.: 16/284,266

(22) Filed: Feb. 25, 2019

(65) Prior Publication Data

US 2019/0189870 A1    Jun. 20, 2019

Related U.S. Application Data

(63) Continuation of application No. PCT/JP2017/029117, filed on Aug. 10, 2017.

(30) Foreign Application Priority Data

Sep. 1, 2016    (JP) .............................. JP2016-171232

(51) Int. Cl.
*H01L 33/56*    (2010.01)
*H01L 33/48*    (2010.01)
(Continued)

(52) U.S. Cl.
CPC .............. *H01L 33/56* (2013.01); *H01L 23/04* (2013.01); *H01L 33/40* (2013.01); *H01L 33/486* (2013.01);
(Continued)

(58) Field of Classification Search
CPC .................... H01L 33/486; H01L 33/60; H01L 2933/0033; H01L 2933/005; H01L 33/56;
(Continued)

(56) References Cited

U.S. PATENT DOCUMENTS

| 2013/0056788 A1* | 3/2013 | Haraguchi | ............ H01L 33/486 |
| | | | 257/99 |
| 2015/0014711 A1 | 1/2015 | Bergenek et al. | |
| 2016/0181479 A1* | 6/2016 | Kim | ...................... H01L 33/486 |
| | | | 257/98 |

FOREIGN PATENT DOCUMENTS

| JP | 2003273405 A | 9/2003 |
| JP | 2003347597 A | 12/2003 |
| | (Continued) | |

OTHER PUBLICATIONS

Machine Translation of JP2015-018873.*
(Continued)

*Primary Examiner* — Julia Slutsker
(74) *Attorney, Agent, or Firm* — Muncy, Geissler, Olds and Lowe, P.C.

(57) ABSTRACT

A light emitting apparatus includes: a package substrate that includes a recess that opens on a top surface of the package substrate; a light emitting device housed in the recess; a window member provided to cover an opening of the recess; and a metal bonding part that seals a space between the package substrate and the window member. The package substrate includes a packaging surface on which the light emitting device is mounted and a metal electrode is provided, an isolation surface provided in a shape of a frame on an outer side of the packaging surface, and a light reflection surface sloping from the isolation surface toward the top surface, and a metal layer is provided on the light reflection surface with a clearance from the isolation surface.

11 Claims, 4 Drawing Sheets

(51) Int. Cl.
*H01L 23/04* (2006.01)
*H01L 33/40* (2010.01)
*H01L 33/60* (2010.01)

(52) U.S. Cl.
CPC .... *H01L 33/60* (2013.01); *H01L 2224/16225* (2013.01); *H01L 2924/16195* (2013.01); *H01L 2933/005* (2013.01); *H01L 2933/0033* (2013.01)

(58) Field of Classification Search
CPC .............. H01L 23/04; H01L 33/40; H01L 2224/16225; H01L 2924/16195
See application file for complete search history.

(56) References Cited

FOREIGN PATENT DOCUMENTS

| JP | 2004179438 A | 6/2004 |
|---|---|---|
| JP | 2005191314 A | 7/2005 |
| JP | 2007266357 A | 10/2007 |
| JP | 2015018873 A | 1/2015 |
| WO | WO2011/118639 A1 | 9/2011 |

OTHER PUBLICATIONS

Machine Translation of JP 2004179438.*
Machine Translation of JP 20044179438, Mar. 24, 2004.*
An International Search Report dated Oct. 31, 2017 in corresponding Application No. PCT/JP2017/029117 is attached.
A Written Opinion dated Oct. 31, 2017 in corresponding Application No. PCT/JP2017/029117 is attached.
An International Preliminary Report on Patentability dated Sep. 12, 2018 in corresponding Application No. PCT/JP2017/029117 is attached.
An Office Action dated Jun. 26, 2018 in corresponding TW Application No. 106128986 is attached.
An Office Action dated Oct. 17, 2017 in corresponding JP Application No. 2016-171232 is attached.
A Chinese Office Action, with English translation, issued in corresponding Patent Application No. 201780052803.3., dated Sep. 30, 2020, 19 pages.
Chinese Office Action issued for Patent Application No. 201780052803.3 dated Apr. 16, 2021; pp. 1-14.

* cited by examiner

OPTICAL SEMICONDUCTOR APPARATUS AND METHOD OF MANUFACTURING OPTICAL SEMICONDUCTOR APPARATUS

RELATED APPLICATION

Priority is claimed to Japanese Patent Application No. 2016-171232, filed on Sep. 1, 2016, the entire content of which is incorporated herein by reference.

BACKGROUND OF THE INVENTION

1. Field of the Invention

The present invention relates to optical semiconductor apparatuses, and, more particularly, to an optical semiconductor apparatus including an optical semiconductor device.

2. Description of the Related Art

Nowadays, semiconductor light emitting devices such as light emitting diodes and laser diodes that emit blue light have been in practical use. Development of light emitting devices that output deep ultraviolet light having a shorter wavelength has also been pursued. Deep ultraviolet light has sterilization capability. Semiconductor light emitting devices capable of outputting deep ultraviolet light have attracted attention as a mercury free sterilization light source in medical and food processing fronts. Recently, efforts have been made to develop semiconductor light emitting devices with a higher emission intensity, irrespective of the output wavelength.

A light emitting device is housed in a package to protect the device from an external environment. For example, a light emitting device is sealed by bonding a substrate on which the light emitting device is mounted and a lid body provided on the substrate. A lid body is built by setting a translucent window member in an opening of a metal frame body. A metal seal ring is provided on the outer circumference of the substrate, and the lid body is fitted between the metal frame body and the seal ring via a brazing filler metal.

In bonding the substrate and the lid body via a brazing filler metal, it is desired to seal them while a load is being applied to the brazing filler metal between the substrate and the lid body in order to improve the quality of bonding. If a portion of the brazing filler metal extruded from between the substrate and the lid body flows toward the packaging surface of the light emitting device, a short circuit between wires may occur and lower the manufacturing yield.

SUMMARY OF THE INVENTION

In this background, an illustrative purpose of the present invention is to provide a technology of improving the reliability and manufacturing yield of an optical semiconductor apparatus.

An optical semiconductor apparatus according to an embodiment of the present invention includes: a package substrate that includes a recess that opens on a top surface of the package substrate; an optical semiconductor device housed in the recess; a window member provided to cover an opening of the recess; and a metal bonding part that seals a space between the package substrate and the window member. The package substrate includes a packaging surface on which the optical semiconductor device is mounted and a metal electrode is provided, an isolation surface provided in a shape of a frame on an outer side of the packaging surface, and a light reflection surface sloping from the isolation surface toward the top surface, and a metal layer is provided on the light reflection surface with a clearance from the isolation surface.

According to this embodiment, the metal layer provided on the sloping light reflection surface makes it possible to reflect the light output sideward from the light emitting device on the metal layer toward the window member and to increase an optical output of the optical semiconductor apparatus. Further, by providing the isolation surface not coated with a metal layer between the light reflection surface and the packaging surface, the flow of the metal bonding member down the sloping light reflection surface is stemmed in the process of sealing the space between the package substrate and the window member with the metal bonding member. This prevents the yield from being lowered due to the metal bonding member flowing down onto the packaging surface.

The isolation surface may be provided at a position one step higher than the packaging surface.

The metal layer may be provided with a clearance from a side surface between the packaging surface and the isolation surface.

The metal layer may be provided in a shape of a frame on the top surface of the package substrate, and the metal bonding part may be bonded to the metal layer provided on the top surface.

The isolation surface may have a width of 100 μm or larger.

The optical semiconductor device may be a light emitting device for emitting deep ultraviolet light, and the window member may include a glass plate having a deep ultraviolet transmittance of 80% or higher. The metal layer may contain gold (Au), and the metal bonding part may contain gold-tin (AuSn).

Another embodiment of the present invention relates to a method of manufacturing an optical semiconductor apparatus. The method includes: housing the optical semiconductor device in the recess of the package substrate; providing the window member to cover the opening of the recess; and sealing the space between the package substrate and the window member with a metal bonding member. The package substrate includes a packaging surface on which the optical semiconductor device is mounted and a metal electrode is provided, an isolation surface provided in a shape of a frame on an outer side of the packaging surface, and a light reflection surface sloping from the isolation surface toward the top surface, a metal layer is provided on the light reflection surface and the top surface with a clearance from the isolation surface, and the sealing includes heating the metal bonding member while a load is being applied between the package substrate and the window member.

According to this embodiment, the flow of the metal bonding member down the sloping light reflection surface is stemmed by the isolation surface in the process of heating and melting the metal bonding member while a load is being applied between the top surface of the package substrate and the frame body. The prevents the yield from being lowered due to the metal bonding member flowing down onto the packaging surface and realizes a highly reliable sealing structure, aided by a bonding process that involves application of a load.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described by reference to the preferred embodiments. This does not intend to limit the scope of the present invention, but to exemplify the invention.

A detailed description will be given of embodiments of the present invention with reference to the drawings. Like numerals are used in the description to denote like elements and duplicate descriptions are omitted as appropriate. To facilitate the understanding, the relative dimensions of the constituting elements in the drawings do not necessarily mirror the relative dimensions in the actual apparatus.

Figure 1:
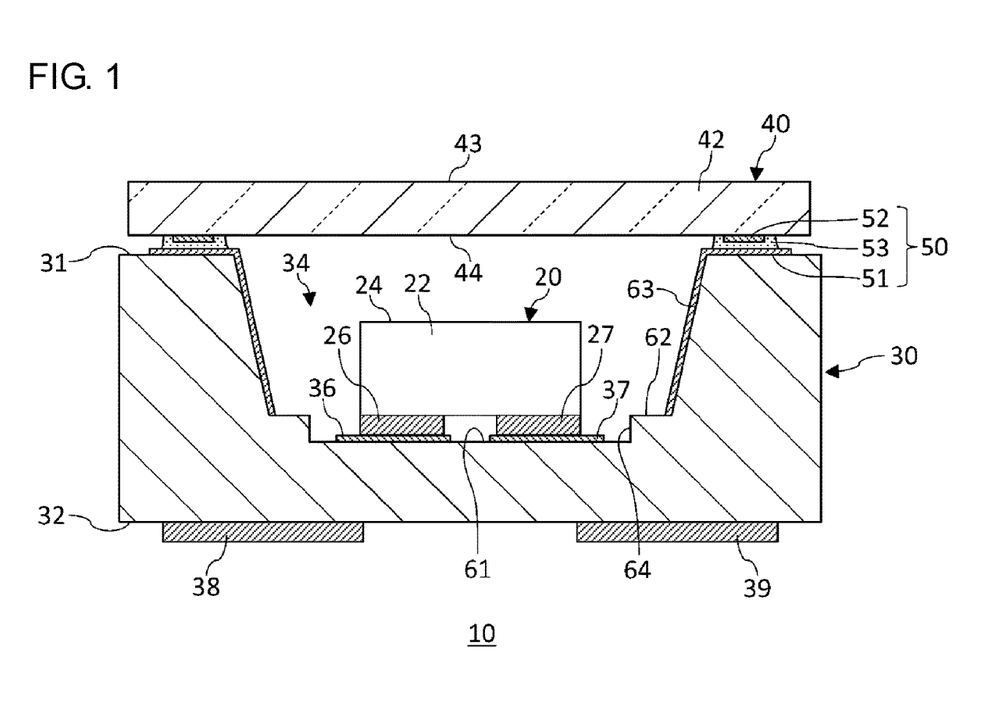
FIG. 1 is a cross-sectional view schematically showing a light emitting apparatus according to an embodiment.
Figure 2:
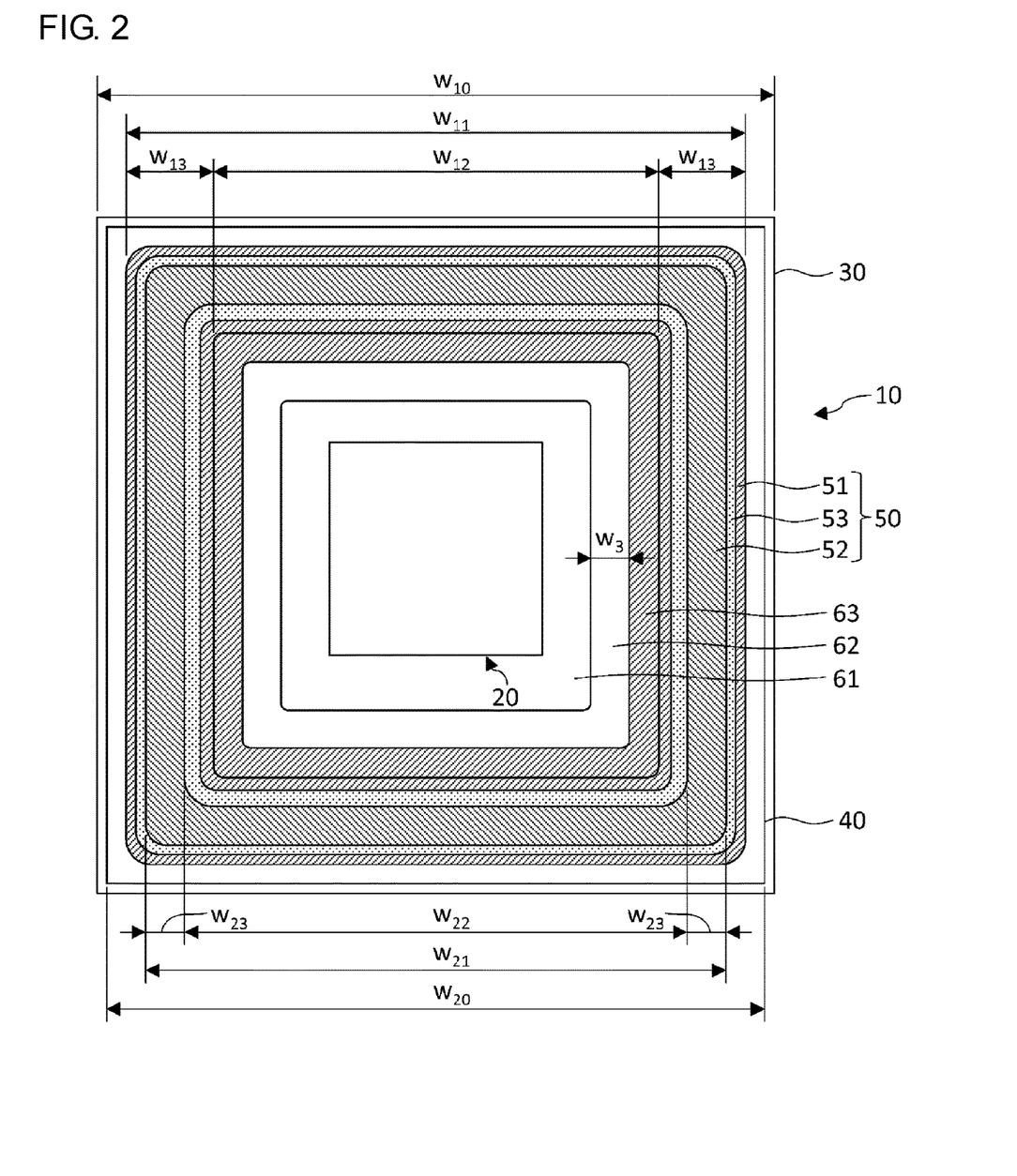
FIG. 2 is a top view schematically showing the light emitting apparatus of FIG. 1.

FIG. 1 is a cross-sectional view schematically showing a light emitting apparatus 10 according to an embodiment, and FIG. 2 is a top view schematically showing the light emitting apparatus 10 of FIG. 1. The light emitting apparatus 10 includes a light emitting device 20, a package substrate 30, a window member 40, and a sealing structure 50. The light emitting apparatus 10 is an optical semiconductor apparatus including the light emitting device 20, which is an optical semiconductor device.

The light emitting device 20 is a light emitting diode (LED) chip configured to emit "deep ultraviolet light" having a central wavelength λ of about 360 nm or lower. To output deep ultraviolet light having such a wavelength, the light emitting device 20 is made of an aluminum gallium nitride (AlGaN) based semiconductor material having a band gap of about 3.4 eV. The embodiment particularly discusses a case of emitting deep ultraviolet light having a central wavelength λ of about 240 nm~350 nm.

The light emitting device 20 includes a semiconductor stack structure 22, a light emission surface 24, a first device electrode 26, and a second device electrode 27.

The semiconductor stack structure 22 includes a template layer, an n-type clad layer, an active layer, a p-type clad layer, etc. built on a substrate that embodies the light emission surface 24. When the light emitting device 20 is configured to output deep ultraviolet light, a sapphire ($Al_2O_3$) substrate is used as the substrate embodying the light emission surface 24, and an aluminum nitride (AlN) layer is used as the template layer of the semiconductor stack structure 22. The clad layer and the active layer of the semiconductor stack structure 22 are made of an AlGaN-based semiconductor material.

The first device electrode 26 and the second device electrode 27 are electrodes for supplying carriers to the active layer of the semiconductor stack structure 22 and are an anode electrode and a cathode electrode, respectively. The first device electrode 26 and the second device electrode 27 are provided opposite to the light emission surface 24. The first device electrode 26 is attached to a first inner electrode 36 of the package substrate 30, and the second device electrode 27 is attached to a second inner electrode 37 of the package substrate 30.

The package substrate 30 is a rectangular member having a top surface 31 and a bottom surface 32. The package substrate 30 is a ceramic substrate that contains alumina ($Al_2O_3$), aluminum nitride (AlN), etc. and is a so-called high temperature co-fired ceramic (HTCC) multilayer substrate.

A recess 34 for housing the light emitting device 20 is provided on the top surface 31 of the package substrate 30. A packaging surface 61, an isolation surface 62, and a light reflection surface 63 are provided in the recess 34. The packaging surface 61 is provided at the center of the recess 34. A first inner electrode 36 and a second inner electrode 37 to which the light emitting device 20 is attached are provided in the recess 34. The isolation surface 62 is provided to surround an area outside the packaging surface 61 or to surround the outer circumference of the packaging surface 61. The isolation surface 62 is provided at a position one step higher than the packaging surface 61. The light reflection surface 63 is provided on the outer side of the isolation surface 62 and slopes from the isolation surface 62 toward the top surface 31. On the bottom surface 32 of the package substrate 30 are provided a first outer electrode 38 and a second outer electrode 39 for mounting the light emitting apparatus 10 on, for example, an external substrate.

The window member 40 is a plate-like protective member provided to cover the opening of the recess 34. The window member 40 is made of a material that transmits ultraviolet light emitted by the light emitting device 20. For example, glass, quartz, crystal, sapphire, etc. may be used. The window member 40 is preferably made of a material having a high deep ultraviolet transmittance and having a high heat resistance and airtightness. It is preferred that the window member 40 is made of a material having a smaller coefficient of thermal expansion than the package substrate 30. Quartz glass is a material having such a property and is desirably used in the window member 40. The ultraviolet light emitted by the light emitting device 20 is output via the window member 40 from an outer surface 43 of the window member 40 to a space outside the package.

The sealing structure 50 includes a first metal layer 51, a second metal layer 52, and a metal bonding part 53.

The first metal layer 51 is provided on the top surface 31 of the package substrate 30 in a shape of a frame. The first metal layer 51 has a rectangular frame shape corresponding to the rectangular package substrate 30 and is chamfered into a round form at the four corners. The first metal layer 51 is formed by, for example, metalizing a ceramic substrate. The first metal layer 51 is formed by plating a base member containing tungsten (W) or molybdenum (Mo) with nickel (Ni), gold (Au), etc. and has, for example, a stack structure of W/Ni/Au. The first metal layer 51 is bonded to the metal bonding part 53.

The first metal layer 51 is also provided on the light reflection surface 63 of the package substrate 30. The metal layer provided on the sloping light reflection surface 63 makes it possible to reflect the deep ultraviolet light output sideward from the light emitting device 20 toward the window member 40 and to output the light outside the package. Meanwhile, the first metal layer 51 is provided with a clearance from the isolation surface 62. In other words, it can be said that a metal layer is not formed on the isolation surface 62, and that the region where the the first metal layer 51 is not formed is the isolation surface 62. The first metal layer 51 is not formed on a side surface 64 positioned between the packaging surface 61 and the isolation surface 62, either.

The second metal layer 52 is provided on an inner surface 44 of the window member 40 in a shape of a frame. The second metal layer 52 has a rectangular frame shape corresponding to the rectangular window member 40 and is chamfered into a round form at the four corners. The second metal layer 52 is formed by a method such as vacuum deposition and sputtering. The second metal layer 52 is a multilayer film in which titanium (Ti), platinum (Pt), and gold (Au) are built on the inner surface 44 of the window member 40 in the stated order. Chromium (Cr) may be used in place of titanium, and copper (Cu) and nickel (Ni) may be used in place of platinum (Pt). The second metal layer 52 is bonded to the metal bonding part 53.

The metal bonding part 53 is provided between the first metal layer 51 and the second metal layer 52 and bonds the package substrate 30 and the window member 40 to seal a space therebetween at the outer circumference of the package. The metal bonding part 53 is configured to fill a space between the first metal layer 51 and the second metal layer 52 and to be positioned on both sides (both inside and outside the package) that sandwich the second metal layer 52. The metal bonding part 53 is made of a metal material having a low melting point and contains, for example, a gold-tin (AuSn) or silver-tin (AgSn) alloy. The metal bonding part 53 spreads between the first metal layer 51 and the second metal layer 52 when melted to form eutectic bonding. It is preferred that the metal bonding part 53 is made of gold-tin containing tin (Sn) in an amount of 20% wt~24% wt to ensure high sealing reliability and a melting temperature of 300° C. or lower.

The sealing structure 50 is configured such that the entirety of the second metal layer 52 overlaps the first metal layer 51 from above, and the entirety of the second metal layer 52 is positioned in a region where the first metal layer 51 is provided. In other words, the sealing structure 50 is configured such that the second metal layer 52 is not positioned in a region where the first metal layer 51 is not provided, and the first metal layer 51 and the second metal layer 52 are not provided out of alignment. More specifically, the outer dimension and the inner dimension of the first metal layer 51 and the second metal layer 52 are adjusted to predetermined sizes described below in detail.

FIG. 2 schematically shows the dimensions of the package substrate 30 and the window member 40. As illustrated, the outer dimension $w_{11}$ of the first metal layer 51 is larger than the outer dimension $w_{21}$ of the second metal layer 52, and the inner dimension $w_{12}$ of the first metal layer 51 is smaller than the inner dimension $w_{22}$ of the second metal layer 52. Therefore, the width $w_{13}$ corresponding to the difference between the outer dimension $w_{11}$ and the inner dimension $w_{12}$ of the first metal layer 51 is larger than the width $w_{23}$ corresponding to the difference between the outer dimension $w_{21}$ and the inner dimension $w_{22}$ of the second metal layer 52. Further, the width $w_{13}$ of the first metal layer 51 is configured to be twice or more as large as the width $w_{23}$ of the second metal layer 52.

In one example, the outer dimension $w_{10}$ of the package substrate 30 is 3.5 mm, and the outer dimension $w_{11}$ of the first metal layer 51 is 3.2 mm, the inner dimension $w_{12}$ of the first metal layer 51 is 2.3 mm, and the width $w_{13}$ of the first metal layer 51 is 0.45 mm. Further, the outer dimension $w_{20}$ of the window member 40 is 3.4 mm, the outer dimension $w_{21}$ of the second metal layer 52 is 3.0 mm, the inner dimension $w_{22}$ of the second metal layer 52 is 2.6 mm, and the width $w_{23}$ of the second metal layer 52 is 0.2 mm. In this example, the inner dimension difference (0.3 mm) between the first metal layer 51 and the second metal layer 52 is larger than the outer dimension difference (0.2 mm) between the first metal layer 51 and the second metal layer 52.

The isolation surface 62 is provided such that the width $w_3$ encircling the outer circumference of the packaging surface 61 is 100 μm or larger, and, preferably, the width $w_3$ is 150 μm or larger. By configuring the isolation surface 62 to have a certain width $w_3$ or larger, it is ensured that the downward flow of a metal bonding member in a melted state from the top surface 31 toward the light reflection surface 63 is stemmed by the isolation surface 62 on which the first metal layer 51 is not provided, allowing the metal bonding member to stay on the isolation surface 62.

Figure 3:
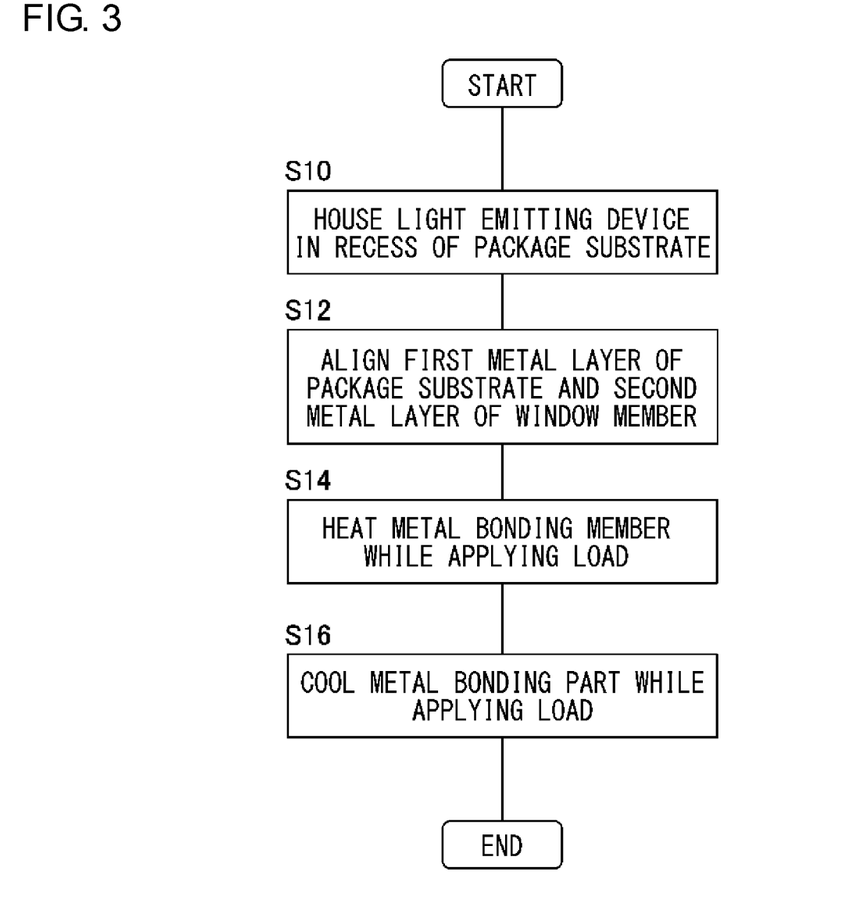
FIG. 3 is a flowchart showing a method of manufacturing the light emitting apparatus according to the embodiment.

A description will now be given of a method of manufacturing the light emitting apparatus 10. FIG. 3 is a flowchart showing a method of manufacturing the light emitting apparatus 10 according to the embodiment. The light emitting device 20 is housed in the recess 34 of the package substrate 30 (S10), the first metal layer 51 of the package substrate 30 and the second metal layer 52 of the window member 40 are aligned so that a metal bonding member 56 (see FIG. 4 mentioned later) is provided between the first metal layer 51 and the second metal layer 52 (S12). The metal bonding member is heated and melted while a load is being applied between the package substrate 30 and the window member 40 (S14). Subsequently, the metal bonding part 53 is cooled and solidified while a load is being applied between the package substrate 30 and the window member 40 (S16).

Figure 4:
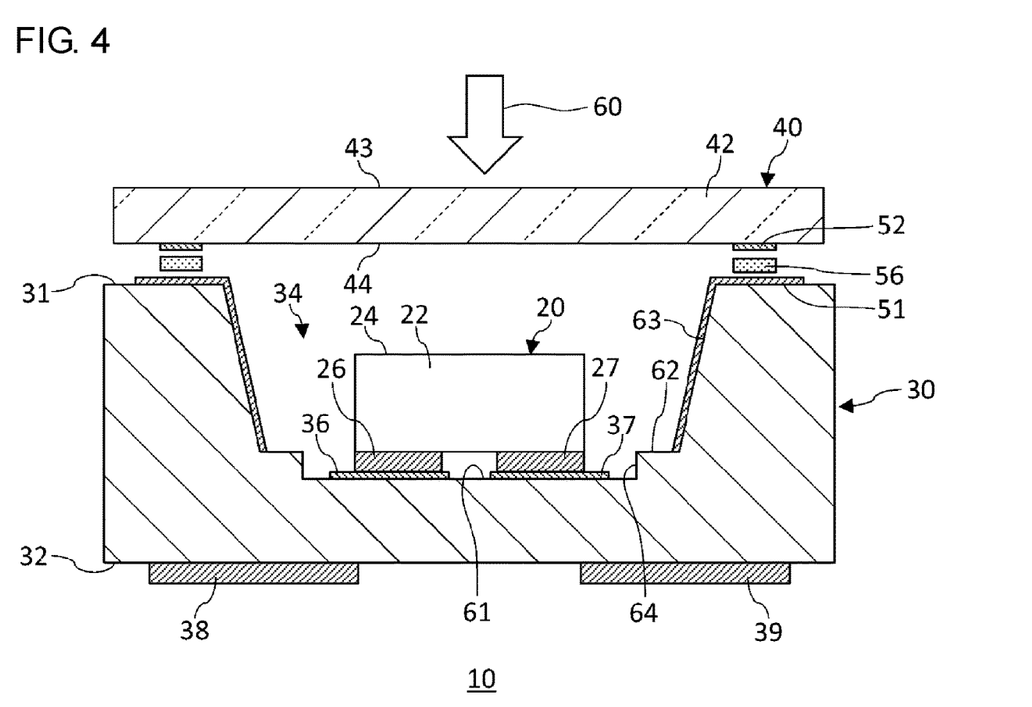
FIG. 4 is a cross-sectional view schematically showing a step of manufacturing the light emitting apparatus.

FIG. 4 is a cross-sectional view schematically showing a step of manufacturing the light emitting apparatus 10 and shows a step of providing the metal bonding member 56 and aligning the package substrate 30 and the window member 40. The package substrate 30 and the window member 40 are positioned so that the entirety of the second metal layer 52 is positioned in the region of the first metal layer 51. By aligning the central positions of the package substrate 30 and the window member 40, the entirety of the second metal layer 52 is provided on the first metal layer 51. Alternatively, the package substrate 30 and the window member 40 may be aligned such that one of the four corners of the package substrate 30 is aligned with one of the four corners of the window member 40. In this case, the central positions of the package substrate 30 and the window member 40 according to the above example will be misaligned within a range of ±50 μm. Regardless, the entirety of the second metal layer 52 is positioned on the first metal layer 51.

The metal bonding member 56 is provided between the first metal layer 51 and the second metal layer 52 thus aligned. The metal bonding member 56 is a gold-tin preform shaped in a rectangular frame corresponding to the second metal layer 52. The metal bonding member 56 has, for example, an outer dimension and an inner dimension identical to those of the second metal layer 52. The metal bonding member 56 may be temporarily secured to the first metal layer 51 or the second metal layer 52. The thickness of the metal bonding member 56 is about 10 μm~50 μm, and, preferably, about 15 μm~30 μm. By sealing the package by using a preform of such a shape and thickness while a load 60 is being applied, the metal bonding part 53 of a thickness of about 5 μm~20 μm is formed. The load 60 applied during sealing is 50 g or larger, and, preferably, 100 g or larger, and, more preferably, 200 g or larger.

The metal bonding part 53 is heated and melted while the load 60 is being applied and spreads between the first metal layer 51 and the second metal layer 52. Since the metal bonding member 56 is extruded between the package substrate 30 and the window member 40, a portion of the metal bonding member 56 may flow down to the interior of the recess via the sloping light reflection surface 63. However, the isolation surface 62 not coated with a metal layer is provided between the light reflection surface 63 and the packaging surface 61 so that the flow of the bonding member is halted by the isolation surface 62 by utilizing the difference in wettability at an interface with the melted metal. For example, the melted metal swells into a ball shape on the isolation surface 62 characterized by lower wettability and remains there.

It is preferred that the step of heating and melting the metal bonding member 56 be performed in an atmosphere of inert gas such as nitrogen ($N_2$). This prevents oxidation the gold-tin preform in a melted state and fills the interior of the package with the inert gas. However, the heating and melting step according to the embodiment may be performed in an atmosphere of dry air containing oxygen ($O_2$). By heating and melting the gold-tin preform while a load is being applied, it is possible to seal the package while also preventing oxidation of the metal bonding member 56 between the first metal layer 51 and the second metal layer 52.

According to the configuration described above, the light emission efficiency and the reliability of sealing of the light emitting apparatus 10 are increased, and the yield in the sealing step is prevented from being lowered. In one example, gold-tin is used for the metal bonding member 56 so that the package is sealed at a relatively low temperature (about 30° C.), and the light reflection surface 63 is plated with gold. Gold (Au) is a material having a relatively high deep ultraviolet reflectivity. Therefore, the light emission efficiency is increased by forming the light reflection surface 63 plated with gold. Even when a portion of the metal bonding member 56 flows out to the light reflection surface 63, the reflectivity on the light reflection surface 63 is not so much affected by the adhesion of the gold-tin bonding member since the main component of the bonding member is gold (Au). Therefore, the relatively high reflectivity on the light reflection surface 63 is maintained even if a relatively large amount of the metal bonding member 56 is used to increase the reliability of sealing and the amount of bonding member flowing out to the light reflection surface 63 is increased as a result.

Figure 5:
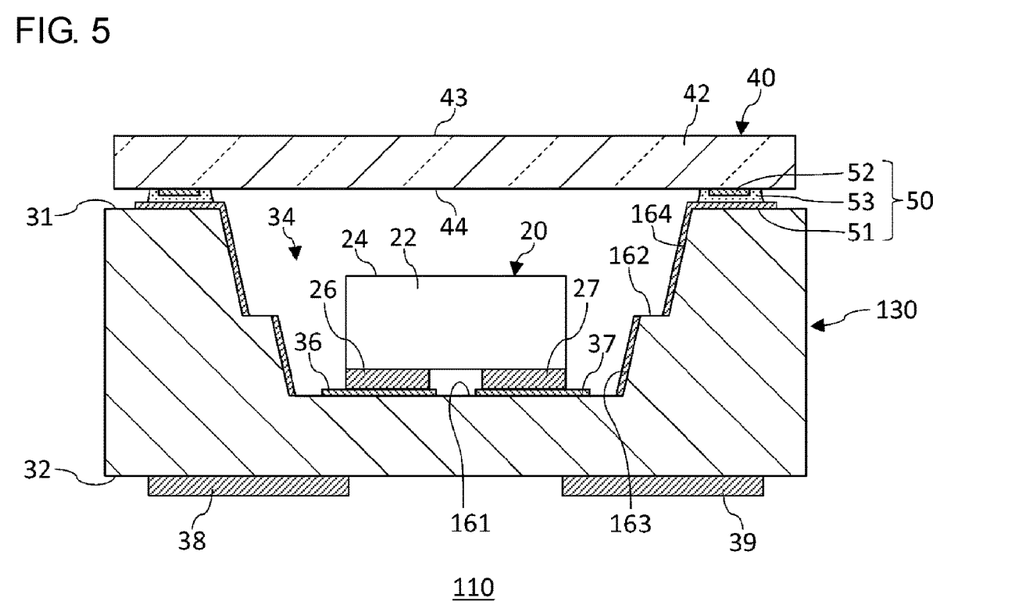
FIG. 5 is a cross-sectional view schematically showing a light emitting apparatus according to a variation.

FIG. 5 is a cross-sectional view schematically showing a light emitting apparatus 110 according to a variation. This variation differs from the embodiment described above in that a first light reflection layer 163 and a second light reflection layer 164 are provided on the outer side of a packaging surface 161 of a package substrate 130, and an isolation surface 162 is provided between the first light reflection layer 163 and the second light reflection layer 164. In other words, the first light reflection layer 163 is provided on the outer circumference of the packaging surface 161, and the isolation surface 162 is provided on the outer circumference of the first light reflection layer 163. A metal layer is provided on the first light reflection layer 163 and the second light reflection layer 164, but a metal layer is not provided on the isolation surface 162. This variation can also provide the same advantage as that of the embodiment described above.

Described above is an explanation based on an exemplary embodiment. The embodiment is intended to be illustrative only and it will be understood by those skilled in the art that various design changes are possible and various modifications are possible and that such modifications are also within the scope of the present invention.

In the embodiment and the variation described above, the case of including only a light emitting device in the package of a light emitting apparatus is shown. In a further variation, electronic components other than a light emitting device may be built in the package to provide additional functions. For example, a Zener diode for protecting the light emitting device from an electric surge may be built in the housing. A fluorescent body for converting the wavelength of the light output by the light emitting device may be built in. Still alternatively, an optical device for controlling the orientation of the light emitted by the light emitting device may be built in.

In the embodiment and the variation described above, a light emitting apparatus in which a semiconductor light emitting device is sealed in the package is shown. In a further variation, the sealing structure described above may be used to seal a light receiving device. For example, the package structure described above may be used to seal a light receiving device for receiving deep ultraviolet light. In essence, the package described above may be used to seal an optical semiconductor device.

In the embodiment and the variation described above, the case of bonding the package by providing a metal layer on the outer circumference of the window member is shown. In a further variation, a metal frame may be provided on the outer circumference of the window member and the frame body and the package substrate may be bonded with a metal. The metal frame provided on the outer circumference of the window member may be made of a material having a coefficient of thermal expansion similar to that of the window member. For example, the metal frame may be made of a kovar alloy. The surface of the kovar metal frame may be plated with gold to increase the quality of bonding with the gold-au alloy.

It should be understood that the invention is not limited to the above-described embodiment but may be modified into various forms on the basis of the spirit of the invention. Additionally, the modifications are included in the scope of the invention.

What is claimed is:

1. An optical semiconductor apparatus comprising:
   a package substrate that includes a recess that opens on a top surface of the package substrate, wherein a first metal layer is provided on the top surface of the package substrate;
   an optical semiconductor device housed in the recess;
   a window member provided to cover an opening of the recess and having an inner surface opposing to the top surface of the package substrate, wherein a second metal layer is provided on the inner surface of the window member; and
   a metal bonding part that bonds to the first metal layer and the second metal layer and seals a space between the package substrate and the window member, wherein
   the package substrate includes:
   a packaging surface on which the optical semiconductor device is mounted and a metal electrode is provided;
   an isolation surface provided in a shape of a frame on an outer side of the packaging surface, the isolation surface being provided at a position one step higher than the packaging surface;
   a side surface provided between the packaging surface and the isolation surface; and
   a light reflection surface sloping from the isolation surface toward the window member, wherein the first metal layer is continuously provided on from the top surface to the light reflection surface and no metal layer is provided on the isolation layer and the side surface.

2. An optical semiconductor apparatus comprising:
a package substrate that includes a recess that opens on a top surface of the package substrate;
an optical semiconductor device housed in the recess;
a window member provided to cover an opening of the recess; and
a metal bonding part that seals a space between the package substrate and the window member, wherein
the package substrate includes:
a packaging surface on which the optical semiconductor device is mounted and a metal electrode is provided;
an isolation surface provided in a shape of a frame on an outer side of the packaging surface;
a first light reflection surface sloping from the packaging surface toward the isolation surface; and
a second light reflection surface sloping from the isolation surface toward the window member, wherein
a metal layer is provided on the first and second light reflection surfaces and no metal layer is provided on the isolation layer.

3. The optical semiconductor apparatus according to claim 1, wherein
the isolation surface has a width of 100 µm or larger.

4. The optical semiconductor apparatus according to claim 1, wherein
the optical semiconductor device is a light emitting device for emitting deep ultraviolet light, and the window member includes a glass plate having a deep ultraviolet transmittance of 80% or higher, and
the metal layer contains gold (Au), and the metal bonding part contains gold-tin (AuSn).

5. A method of manufacturing the optical semiconductor apparatus according to claim 1, comprising:
housing the optical semiconductor device in the recess of the package substrate;
providing the window member to cover the opening of the recess; and
sealing the space between the package substrate and the window member with a metal bonding member, wherein
the sealing includes heating the metal bonding member while a load is being applied between the package substrate and the window member.

6. The optical semiconductor apparatus according to claim 1, wherein
no metal layer is provided on an outer circumference area of the packaging surface adjacent to the isolation layer.

7. The optical semiconductor apparatus according to claim 2, wherein
no metal layer is provided on an outer circumference area of the packaging surface adjacent to the second light reflection layer.

8. The optical semiconductor apparatus according to claim 1, wherein
no metal layer is provided on a side surface of the window member.

9. The optical semiconductor apparatus according to claim 2, wherein
no metal layer is provided on a side surface of the window member.

10. The optical semiconductor apparatus according to claim 1, wherein
the metal bonding part is not bonded to a side surface of the window member.

11. The optical semiconductor apparatus according to claim 2, wherein
the metal bonding part is not bonded to a side surface of the window member.

* * * * *